United States Patent [19]
Smith

[11] Patent Number: 5,939,895
[45] Date of Patent: Aug. 17, 1999

[54] FROZEN WAVE HIGH SPEED RECEIVER

[75] Inventor: Andrew D. Smith, Redondo Beach, Calif.

[73] Assignee: TRW Inc., Redondo Beach, Calif.

[21] Appl. No.: 08/874,403

[22] Filed: Jun. 13, 1997

[51] Int. Cl.⁶ .................................................. H03K 19/195
[52] U.S. Cl. .................................................. 326/1; 326/21
[58] Field of Search .................................. 326/1, 3, 5, 21, 326/30, 82; 327/366, 367, 370

[56] References Cited

U.S. PATENT DOCUMENTS

| | | |
|---|---|---|
| 4,393,357 | 7/1983 | Linnenbrick et al. . |
| 4,499,441 | 2/1985 | Lynch et al. . |
| 4,742,333 | 5/1988 | Willhite . |
| 5,119,368 | 6/1992 | Hiltner et al. . |
| 5,126,598 | 6/1992 | Kotani . |
| 5,189,420 | 2/1993 | Eddy et al. . |
| 5,305,006 | 4/1994 | Lee . |
| 5,307,063 | 4/1994 | Kratz et al. . |
| 5,355,085 | 10/1994 | Igarashi et al. . |
| 5,400,026 | 3/1995 | Bradley . |
| 5,420,586 | 5/1995 | Radparvar . |
| 5,479,120 | 12/1995 | McEwan . |

OTHER PUBLICATIONS

Harold Weinstock and Richard W. Ralston, The New Superconducting Electronics, 1993, Chapter 12.

*Primary Examiner*—Jon Santamauro
*Assistant Examiner*—Don Phu Le
*Attorney, Agent, or Firm*—Michael S. Yatsko

[57] ABSTRACT

A high-speed receiver is disclosed for gathering data from an information signal carried on a superconducting transmission line. The high-speed receiver includes triggers that carry trigger pulses, and a plurality of superconducting sensors magnetically coupled to the transmission line. The sensors respond to the trigger pulses by capturing data from the information signal. The sensors may operate in a variety of capacities, including comparators, A to D converters, and logic functions.

20 Claims, 1 Drawing Sheet

FROZEN WAVE HIGH SPEED RECEIVER

BACKGROUND OF THE INVENTION

The present invention relates to high-speed receivers and detectors. More particularly, this invention relates to a scalable high-speed receiver that uses a set of sensors operating in parallel that are magnetically coupled to a transmission line to gather data from a high-speed information signal carried on the transmission line.

Today's high-speed communication networks are capable of sending data over transmission lines at extremely high data rates. Pushing far past the speeds of telephone company T1 lines carrying data at a comparative crawl (approximately 1.5 Mbps), high-speed transmitters using optical fiber transmission lines support data rates of 10 to over 100 Gigabits per second (Gbps). Defined standards already exist for extremely high data rates, including the optical carrier (OC) network standards OC-3 (155 Megabits per second (Mbps)), OC-12, (622 Mbps), OC-48 (2.5 Gbps), OC-192 (10 Gbps), and OC-768 (40 Gbps). SONET (synchronous optical network) networks running at OC-12 and OC-48 rates are becoming common, and data intensive full screen video conferencing will require OC-192 and OC-768 networks. Virtually all data intensive applications benefit from increased network speeds, and these applications may use high-speed transmitters to place any combination of analog or digital data on the communication network. Such data may come from diverse sources, ranging anywhere from Internet data transfers and telephone conversations to television signals. The data travelling down the transmission line may generally be conceptualized as an information signal passing through the transmission line, with the amplitude of the information wave at each point in the line varying in time as the information wave travels by. Accurately gathering the data contained in the information signal while the data travels at full speed is generally more difficult than simply placing the information signal on the transmission line.

Constructing receivers for high-speed communication networks is difficult because of the extremely high data rates involved. FIG. 1 shows the disparity in typical speeds achieved in today's receivers and today's fiber transmitters. Optical sensors are limited to sensing speeds of approximately 10 Gbps and receiver/demultiplexer electronics are limited to operating speeds of approximately 1 Gbps. Regardless of whether the receiver could accurately gather all the information at full speed, the receiver would often have to convert the data rate to a slower output data rate in order to accommodate the maximum operating speed of the device handling the data (for example, a desktop computer). Many popular desktop computer microprocessors are currently limited to data bus speeds that are far slower than the maximum fiber optic communication network data rate. For example, Intel Pentium™ processors are typically limited to 66 MegaHertz (MHz) bus speeds, while Cyrix™ processors may run their data bus at up to 75 MHz. These speeds are orders of magnitude slower than the maximum fiber optic communication network data rate. And, of course, since a significant portion of a microprocessor's time is spent fetching code and handling other tasks that require the data bus, the full data bus bandwidth is not ordinarily available for dedicated data processing. As a result of the disparity in processing and receive speeds, designers have expended much effort, with limited success, in designing receivers that can handle the highest speed communications networks.

In the past, most attempts at constructing high-speed receivers have centered on using sensors spaced along the transmission line to detect and gather data contained in the information signal. As the information signal travels down the transmission line, the sensors are activated in parallel to capture the data in the information signal at each sensor location at the time the sensors are activated. The sensors are usually constructed from very fast semiconductor electronics in order to support high-speed information signals. These sensors commonly use high-speed transistors constructed from expensive materials like Gallium Arsenide and Indium Phosphide. The physical properties underlying these materials allow the transistors to switch faster and therefore to gather data at higher rates than typical silicon transistors. The high-speed transistors may also perform rudimentary manipulations on the gathered data, such as sorting the data into parallel outputs at slower data rates. Unfortunately, even these high-speed transistors face severe limitations that reduce their effectiveness and prevent them from offering a practical high-speed receiver solution. Not only are the high-speed transistors currently unable to approach switching speeds nearing that of the fastest optical fiber communications network data rates, but as their structure is modified to attempt higher switching speeds, they also become more difficult to manufacture, suffer from lower yields, drive up costs, consume more power, and generate more heat. Furthermore, many common high-speed receiver designs also lead to destructive read out of the information signal. Destructive readout occurs when the operation of the sensors spaced along the transmission line significantly degrades the characteristics of the information signal as it passes by the sensors. Destructive readout prevents further information retrieval or manipulation of the information signal.

U.S. Pat. No. 5,479,120 to McEwan discloses a conventional high speed receiver having a plurality of sampler banks. Each bank comprises a sample transmission line for transmitting an input signal, a strobe transmission line for transmitting a strobe signal, and a plurality of sampling gates at respective positions along the sample transmission line for sampling the input signal in response to the strobe signal.

However, McEwan's high-speed receiver uses direct physical contacts that connect the sensors with the transmission line. The contacts connect the information detector sensors with the information signal itself as it travels down the transmission line. However, McEwan's contacts create destructive parasitic capacitance and inductive loading on the transmission line, making it harder to drive an information signal onto the transmission line and degrading the signal quality of the information signal once it is placed on the transmission line and as it travels down the transmission line. Furthermore, when the sensors operate to capture the data contained in the information signal, they disturb current flow in the transmission line, further damaging the information signal and producing perturbations of the information signal (commonly called "kickouts"). Kickouts can travel down the transmission line backward to previous sensors and forward to subsequent sensors and thereby affect data capture at other sensor contacts. As a result of the foregoing difficulties, direct physical connection of sensors to the transmission line invariably requires additional components to link the sensor with the transmission line, while providing over-voltage and current protection, and suppressing kickouts. These additional components, of course, increase the size, power consumption, and cost of the receiver.

A need remains for an improved high speed receiver. It is an object of the present invention to meet this need.

BRIEF SUMMARY OF THE INVENTION

It is an object of the present invention to provide a high-speed receiver that may accurately gather data from an information signal running at an extremely high data rate.

It is another object of the present invention to provide a high speed receiver that disturbs the information signal as it passes along the transmission line by a minimal amount.

Another object of the present invention is to provide a high-speed receiver that consumes a very small amount of power by taking advantage of superconducting electronics.

Yet another object of the present invention is to provide a high speed receiver which reduces the data rate at which the incoming information signal must be received.

Still another object of the present invention is to provide a high-speed receiver circuit layout that fits into a small area on an integrated circuit die.

Still another object of the present invention is to provide a high-speed receiver with a circuit layout that may be easily scaled to provide additional sensors or a longer transmission line.

Another object of the present invention is to provide a high-speed receiver that uses fewer components to allow for a smaller, simpler, and less expensive high-speed receiver.

Another object of the present invention is directed to resolving these and other disadvantages of the prior art by using superconducting devices to address the construction and operational difficulties in building a high-speed receiver. In particular, the invention uses a superconducting transmission line that has substantially zero power loss combined with extremely lower power superconducting sensor circuits. The sensor circuits are placed along the line in such a manner that they are magnetically coupled to the superconducting transmission line rather than being directly physically connected. The magnetically coupled sensors and the transmission line may be maintained in a superconducting state, for example, by cooling them to a liquid helium temperature of approximately 4 Kelvin.

An individual magnetically coupled sensor may comprise a simple comparator that provides a voltage level detection (essentially a one bit output). Additionally, a magnetically coupled sensor may provide the functionality of an analog to digital (A/D) converter that provides multiple output bits representing a digital value of the information signal at the sensor. A magnetically coupled sensor may also be configured to provide the functionality of a logic function that produces a single or multiple bit output.

The circuitry utilized in the preferred embodiment of the present invention may be laid out in a repetitive pattern in a very small area on an integrated circuit die. Thus, the high-speed receiver may be scaled to larger sizes by placing additional sets of circuitry on the same die and interconnecting each set.

DETAILED DESCRIPTION OF THE INVENTION

Figure 1:
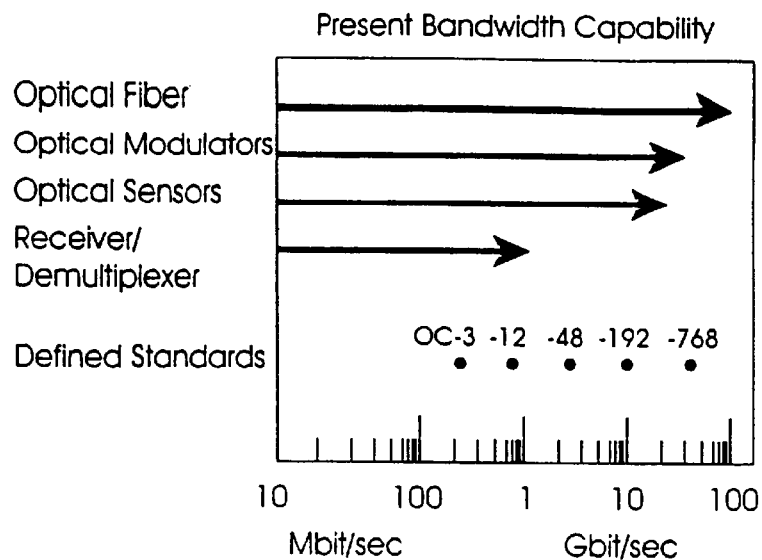
FIG. 1 shows a graph illustrating the typical speeds of commonly used high-speed communication networks and receivers.
Figure 2:
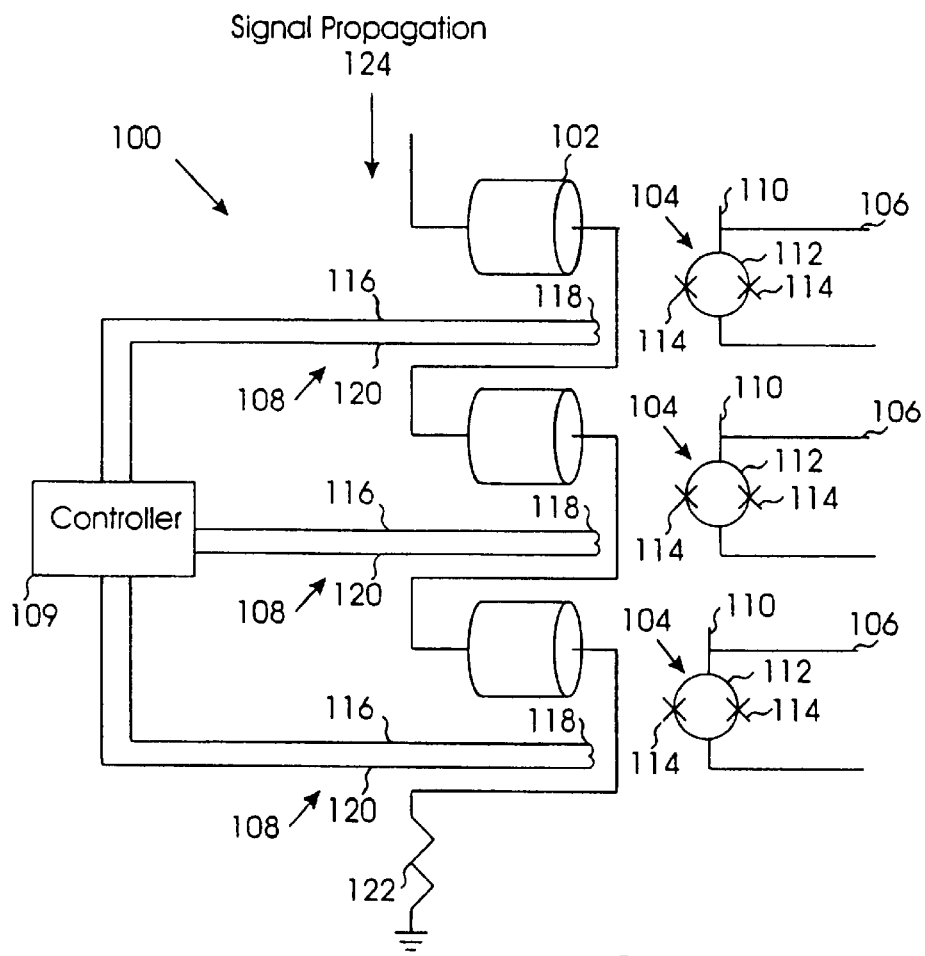
FIG. 2 shows a high level schematic diagram depicting a portion of a transmission line and associated magnetically coupled sensor arrangement.

FIG. 2 shows a high level schematic representation of a small section of a high-speed receiver 100 according to the present invention. Transmission line 102 carries an information signal in the receiver 100. The receiver 100 includes numerous magnetically coupled sensors 104 distributed along a receiving section of the transmission line 102. The magnetically coupled sensors 104 generate data outputs 106 based upon the information that the magnetically coupled sensors 104 detect in the information signal on transmission line 102. The high-speed receiver 100 includes trigger inputs 108 that may be used to activate the magnetically coupled sensors 104. Optionally, the magnetically coupled sensors 104 may use a DC Bias connection 110 for proper operation, while other designs of magnetically coupled sensors 104 may not. As mentioned above, FIG. 2 represents only a small portion of the entire high-speed receiver 100, which may, for example, consist of a much longer transmission line 102 and/or additional magnetically coupled sensors 104.

The high-speed receiver uses a plurality of sensors 104 spaced apart from one another and located adjacent a receiving section of the transmission line 102. Each sensor 104 is located proximate a corresponding trigger 108. The triggers 108 are spaced apart from one another and located juxtaposed to the sensors 104. The triggers 108 are individually driven by a controller 109. As explained below, the controller 109 drives the triggers with pulses which, in turn, direct the sensors 104 to sample the present set of data values of the information signal at the points on the transmission line 102 immediately adjacent the sensors 104. The controller 109 may be located in proximity to the transmission line 102 and may even be built on the same die as the high-speed receiver 100. Alternatively, the controller 109 may comprise external timing equipment connected to the individual triggers 108 through, for example, input pads on the die. Throughout this specification, reference will be made to the die as being a semiconductor die. Although this is the preferred material, it should be understood that the die could be made of other materials, such as superconducting materials.

Turning now to the transmission line 102, it is used as a propagation medium for an information wave and is preferably cooled to a liquid helium superconducting temperature, typically 4 K. The superconductor temperature may increase as research into high temperature superconductors advances the state-of-the-art in superconductivity. When in a superconducting state, the transmission line 102 provides an extremely low resistance and low loss propagation path for an information signal. The transmission line 102 may be constructed from superconducting materials including, for example, Niobium and Niobium Nitride. These materials generally provide the highest reliability for fabrication of large circuits and further provide favorable superconducting properties, including extremely low resistivity and low loss. Furthermore, commercial foundries have the capability to create designs from these materials once provided with a chip specification and layout.

The transmission line 102 may be constructed as a microstrip transmission line. A microstrip transmission line is typically built as a conducting layer or conducting trace separated from a ground plane by a dielectric layer. Thus, on a semiconductor die, metallization on the top surface of the substrate may be connected to ground and serve as a ground plane, while an insulating layer on top of the ground plane may serve as a dielectric and support a conducting layer possibly constructed from Niobium. This is simply one example; the high-speed receiver 100 is not limited to using transmission lines 102 constructed in any particular way.

Current fabrication processes can create a transmission line 102 that is approximately 5 to 10 microns wide, with spacing between lines of approximately 5 to 10 microns. As a result, routing the transmission line 102 in a snaking or zig-zag pattern back and forth across the die can be accomplished to produce a very dense layout. In fact, the high-speed receiver 100 may fit a 10 cm long transmission line 102 and one-hundred or more magnetically coupled sensors 104 in an area of approximately 1 mm$^2$. The total semiconductor die area, including bonding pads and associated input circuitry, for a 10 cm long transmission line 102 and at least one-hundred magnetically coupled sensors 104 may easily fit into a 5 mm$^2$ area. The ability to place the high-speed receiver 100 in a small area allows a single semiconductor die to contain multiple high-speed receivers 100, or an extremely long transmission line 102 and additional magnetically coupled sensors 104, or perhaps additional unrelated circuitry in combination with the high-speed receiver 100.

Turning now to the magnetically coupled sensors 104, they are used to gather data from the information wave traveling down the transmission line 102 and may be constructed from, for example, Superconducting Quantum Interference Devices (SQUIDs). SQUIDs are generally known in the art and detailed information on them may be found in references, such as to Harold Weinstock and Richard W. Ralston, *The New superconducting electronics*, Kluwer Academic Publishers, 1993, which is incorporated in its entirety by reference.

A simple SQUID may be fabricated using a loop of superconducting material 112, one or more Josephson junctions 114, and a DC Bias input 110. A simple SQUID results from taking a loop of superconductor material 112, opening the loop, and inserting two Josephson junctions 114. More complicated SQUIDs can be created using additional Josephson junctions 114 or by interconnecting simple SQUIDS, for example.

A Josephson junction 114 (named after its discoverer B. D. Josephson) may be constructed by separating two superconductors with a barrier made with a thin insulating layer or normal metal layer. The barrier may be a non-superconducting layer. Normally, the barrier would block the current flow through the first superconductor, but if the barrier is thin enough, the electrons making up the current can quantum mechanically tunnel through the barrier and continue to flow. This property can be exploited to create a number of useful superconducting devices including SQUIDs, SQUID sensors, logic circuitry, and microprocessor building blocks. The Josephson junctions 114, in conjunction with the DC Bias inputs 110, provide the mechanism by which a SQUID operates.

The DC Bias input 110 connect the SQUID with a current source. The current supplied through the DC Bias input 110 sets up an initial current flow in the SQUID. During its operation, a SQUID reacts to perturbations in the initial current flow caused by external events to produce useful information about the external event. The external event may, for example, be a changing magnetic field generated by an information signal traveling down a transmission line 102.

When a magnetic field is present in the region of the SQUID, the magnetic field induces, through magnetic coupling between the magnetic field and the SQUID, additional current flow in the loop of superconducting material 112. The high-speed receiver 100 uses magnetically coupled sensors 104 placed in close proximity along the transmission line 102 such that the strength of the magnetic coupling between the magnetically coupled sensor 104 and the transmission line 102 is on the order of approximately 4 pico-Henries (pH). The precise strength of the magnetic coupling may vary depending on the material and layout used to fabricate the high-speed receiver 100. Furthermore, the abrupt latching behavior is a positive for many applications. The presence of a magnetically coupled signal may induce the SQUID to transit from a stable zero voltage state to a stable "voltage state," typically 2.8 mV for latching logic using niobium. As the additional current generated through the magnetic coupling crosses the Josephson junctions 114, a measurable voltage may be observed on the data outputs 106. The measurable voltage is related to the strength of the magnetic field affecting the SQUID. Thus, SQUIDs are very useful as magnetometers; that is, they are useful for measuring magnetic fields. It is well known that current flow through a conductor creates a magnetic field around that conductor. A SQUID, therefore, may be used to detect the magnetic fields created by the propagation of an information signal through transmission line 102. The strength of the magnetic coupling of the SQUID to the transmission line 102 by itself may not be great enough to make the SQUID switch to a new voltage output state. Rather, a SQUID may be commanded to change its output voltage state by presenting the SQUID with a trigger pulse as will be described below.

SQUIDs may also provide the building blocks for more complex sensor functions. For example, the high-speed receiver 100 may use logic gates such as OR and AND gates based on SQUID devices for its magnetically coupled sensors 104. An even more sophisticated arrangement of SQUIDs may be assembled to perform the function of a memory cell or A/D conversion. Thus, the magnetically coupled sensors 104 are not limited in function to simple comparators; rather, they may decide arbitrary complex functions.

In the high-speed receiver 100, number and spacing of magnetically coupled sensors 104 needed along the transmission line 102 may vary. One factor that may be used in determining the number and spacing of sensors is the propagation speed of the information signal. The speed of an information signal in a conductor is, of course, bounded by the speed of light. The typical speed of light, approximately 1 foot per nanosecond (ns), still applies in a superconductor and in particular in the transmission line 102. The transmission line 102 exhibits a dielectric constant and impedance which depends upon the medium of the transmission line. The propagation of electromagnetic signals through the transmission line 102 is hindered depending on the dielectric constant and superconducting magnetic penetration effects, slowing the propagation speed of the information signal through the transmission line 102. The propagation speed of the information signal in the transmission line 102 is typically 100 microns per picosecond (ps), but may depend on the particular construction of the transmission line 102.

By way of example, in the case where the propagation speed of the information signal in the transmission line 102 is 100 microns/ps and the information signal is running at a 100 Gbps data rate, one bit of data occupies 10 ps of time and is spread across a distance of 1000 microns or 0.1 cm. Knowing this, a designer may then construct a transmission line 102 that is 10 centimeters (cm) long and distribute 100 equally spaced magnetically coupled sensors 104 along the transmission line 102 to capture data in the information signal at 10 ps intervals. The placement of the magnetically coupled sensors 104 may take into consideration certain characteristics of the incoming information signal. For example, the high-speed receiver 100 may gather data from an information signal that spreads its data out in a non-uniform manner. In such a case, it may be desirable to place the magnetically coupled sensors 104 closer together or farther apart to match the location of the interesting data in the information signal.

Furthermore, the high-speed receiver 100 can also gather data from an information signal that contains analog information or a combination of analog and digital information. In such a case, the magnetically coupled sensors 104 may be configured as A/D converters and may be equally spaced to provide a high speed A/D converter, or may be nonuniformly spaced to record only the predetermined interesting parts in the information signal. Finally, the high-speed receiver 100 may use a combination of different types of magnetically coupled sensors 104 in operation. Thus, the high-speed receiver 100 may use a series of magnetically coupled sensors 104 configured as A/D converters followed by a series of magnetically coupled sensors 104 configured as one bit comparators to gather data from an information wave of analog data followed by digital data.

Alternatively, the high-speed receiver 100 may use any combination or permutation of magnetically coupled sensors 104 to match the information signal or design goals of the high-speed receiver 100. The magnetically coupled sensors 104 operate by capturing data from the information signal in response to trigger pulses presented on the command of trigger inputs 108.

A trigger input 108 consists of a trigger pulse input 116, an inductor 118 connected in series with the trigger pulse input 116, and a trigger pulse output 120 connected in series with the inductor 118. The trigger pulse input 116 provides a mechanism through which a trigger pulse may be applied to the inductor 118. The current pulse output 120 provides a mechanism through which the trigger pulse returns after it has passed through the inductor 118. The inductor 118 operates as a classic inductor and is fabricated to provide an inductance on the order of a few pH. The trigger pulse input 116, trigger pulse output 120, and inductor 118 may be constructed with typical superconductor materials including Niobium, and niobium nitride.

The high-speed receiver 100 uses magnetically coupled sensors 104 in conjunction with trigger inputs 108 to gather data from the information signal. Although it would be possible, the magnetically coupled sensors 104 typically are not designed to change output voltage state due to the mere presence of the magnetic field caused by the information signal traveling along transmission line 102. Instead, the presence of a trigger pulse flowing through the inductor 118 adds an additional component to the magnetic field that is large enough to sensitize the SQUID to function, for example, by computing a logic output or performing an A/D conversion. Each magnetically coupled sensor may be individually controlled by independent trigger inputs 108, or a number of magnetically coupled sensors may be controlled by the same trigger input 108.

In operation, an external interface mechanism couples an information signal, generated by an outside source, into the transmission line 102. An Information signal may be coupled into the transmission line 102 in a variety of manners. If, for instance, an optical fiber carries the information signal, a detector photodiode may couple the optical fiber signal onto the transmission line 102. Because optical fibers can withstand the very low temperatures to which the transmission line 102 is cooled, the optical fibers may run directly to the beginning of the transmission line 102 where a detector photodiode may convert the optical fiber signal into an electrical signal and couple the resultant electrical signal directly into the transmission line 102. Similarly, electrical conductors may couple an information signal into the transmission line 102. Electrical conductors with low thermal conductivity, but sufficient electrical conductivity may attach directly to the transmission line 102. Examples of commercially available conductors that are suitable for this task include stainless steel cables or Beryllium copper coaxial cable. Note also that the high-speed receiver 100 may include a termination resistor 122 attached to the end of the transmission line 102. The termination resistor 122 is matched to the impedance of the transmission line 102 in order to prevent an information signal on the transmission line 102 from reflecting back along the transmission line. A transmission line 102 constructed as a microstrip may have a typical impedance of 50 ohms. In such a case, the termination resistor 122 may also have a value of 50 ohms to match the transmission line 102. The information signal propagates in the transmission line 102 in the direction shown by arrow 124. Once provision has been made to couple an information signal onto the transmission line 102, the high-speed receiver 100 is ready to gather data from the information signal.

The high-speed receiver 100 allows the information signal to travel down the transmission line 102 until the signal "fills" the transmission line 102. Stated another way, the high-speed receiver 100 applies a trigger pulse on the trigger inputs 108 after the information signal present at the beginning of the transmission line 102 propagates to the last magnetically coupled sensor 104 distributed along the transmission line 102. Thereafter, a controller 109 generates a trigger pulse that is applied to the trigger pulse inputs 116. The high-speed receiver 100 may allow the information signal data to travel the entire length of the transmission line 102 between trigger pulses, or it may allow the information signal data to travel a shorter distance or a longer distance depending on the particular goals of the receiver or the characteristics of the information wave. For example, if a section of the information signal carries no data over an extended period time, the controller 109 may allow that entire section to travel by the sensors 104 without generating any triggers. In operation, the controller 109 may produce a trigger signal shortly before the information signal propagates to the end of the transmission line 102 to take into account the propagation delay inherent in the trigger inputs 108. The controller 109 adjusts the delay to ensure that the trigger signal arrives at the inductor 108 in temporal coincidence with the information signal data to properly position the information signal data across the magnetically coupled sensors 104. When applied to the trigger pulse input 116, the trigger pulse travels through the inductor 118 and generates an additional magnetic field that causes the magnetically coupled sensors 104 to switch output voltage states according to their functions. The switch in output voltage states is reflected as measurable voltage output on data outputs 106.

The length of the trigger pulse determines the duration for which magnetically coupled sensors 104 are activated to gather information from the information signal. Preferably, the controller 109 generates a trigger that is short compared to the fastest characteristic of the signal on the transmission line 102. Doing so reduces the distorting and overlapping effects caused by the propagation of other parts of the information signal across the magnetically coupled sensor 104 while it is activated. In the preferred embodiment of the high-speed receiver 100, the trigger pulse duration is 10 ps or less to allow the magnetically coupled sensors 104 to gather data from a 100 Gbps information signal. Shorter trigger pulses may be applied to allow the magnetically coupled sensors 104 to accurately capture faster information signals. Trigger pulses shorter in duration than 3 ps have been achieved.

The high-speed receiver 100 may use magnetically coupled sensors 104 arranged on the semiconductor die such that each magnetically coupled sensor 104 is affected by the trigger pulse simultaneously. The high-speed receiver 100 may accomplish this, for example, by making each connection to a trigger input 108 equidistant from the point where the trigger pulse first arrives on the die. Additionally, a the high-speed receiver 100 may provide multiple trigger input pads on the semiconductor die that accept the trigger pulse as an input and ensure equal length connections from all the trigger input pads to the magnetically coupled sensors 104. The magnetically coupled sensors 104 respond to the trigger pulse applied to the trigger inputs 18.

In one embodiment of the high-speed receiver 100, the magnetically coupled sensors 104 are configured as comparators, and the magnetically coupled sensors 104 react to the trigger pulse by indicating if the data value of the section of the information signal located at the magnetically coupled sensor 104 is above a predetermined threshold. The resultant outputs provide a picture of the information signal frozen in time, i.e., a "frozen wave". The controller 109 then allows the information signal 102 to propagate down the transmission line 102 until the next data section of the information signal fills the transmission line 102. The trigger process then repeats. The magnetically coupled sensors 104 gather data from the information signal and provide it in reduced speed on data outputs 106. The speed at which data is gathered depends upon how many magnetically coupled sensors 104 are placed along the transmission line 102. For example, if one-hundred sensors 104 are magnetically coupled along the transmission line 102, a section of the transmission line 102 carrying an information signal of 100 Gbps is reduced to one-hundred parallel data outputs 106, each operating at 1 Gbps. The high-speed receiver 100 not only slows the information signal to a more manageable rate through parallel data outputs 106, but it also provides advantages over previous receiver designs because the magnetically coupled sensors 104 are not directly physically connected to the transmission line 102.

The high-speed receiver 100 uses magnetically coupled sensors 104 in conjunction with the transmission line 102. Optionally, the preferred embodiment uses weak magnetic coupling as described above to minimize any undesirable information signal degrading effects or kickouts, if any, caused by the magnetic coupling. In the high-speed receiver 100, any kickout occurs only during the time when the magnetically coupled sensors 104 are activated by the trigger pulse. Because the trigger pulse width is very small (only a few ps), there is only a small window of active operation in which the transmission line 102 may be perturbed, if at all. A perturbation normally propagates in both directions along the transmission line 102, but due to the small window of active operation, the trigger strobe will have passed and the adjacent magnetically coupled sensor 104 will be inactive by the time the perturbation reaches an adjacent magnetically coupled sensor 104. Furthermore, by using weak magnetic coupling, very little energy is required to allow the magnetically coupled sensor 104 to gather data from the information signal.

The high-speed receiver 100 may operate, for instance, with an information signal containing less than one milliwatt of power. The amount of energy required to switch output voltage states is extremely tiny, on the order of femto or atto joules. Multiplying the energy requirements by the operating frequency of the trigger pulses applied to the trigger inputs 108 results in power and energy consumption levels in the high-speed receiver 100 that are orders of magnitude lower than what the information signal contains and what previous receivers have consumed.

Previous receivers typically require large amounts of energy to switch their sensors. As a result, the previous receivers encounter difficulties in speed, heat, and power consumption. Each magnetically coupled sensor 104 may consume approximately 1 to 10 microwatts or less of power supply power. A further benefit of magnetic coupling of the preferred embodiment is that the overall integrity of the information signal is maintained since any energy that is coupled into the information signal due to the operation of the magnetically coupled sensors 104 is miniscule compared to the overall energy in the information signal. Thus, additional equipment may subsequently examine the information signal accurately. Once the magnetically coupled sensors 104 have gathered the data from the information signal, the gathered data can be sent off the chip for processing by external devices.

Each data output 106 may connect to external equipment over a transmission medium. The transmission medium carries the measurable voltage output produced on each data output 106 on some type of conductor, for example, a fiber optic cable or an electrical conductor. The transmission medium may be connected to the data outputs 106 in a variety of manners, including coupling each data output through a photodiode and onto a fiber optic transmission line. The fiber optic line can then carry the data out of the cold, off the die, and on to the external equipment. Similarly, electrical conductors with low thermal conductivity, but sufficient electrical conductivity may attach to the data outputs 106. These electrical conductors can then run off semiconductor die to the external equipment.

I claim:

1. A high-speed receiver for receiving data from a transmission line carrying an information signal, the high-speed receiver comprising:

a superconducting transmission line for carrying data in an information signal;

a plurality of triggers, located proximate a receiving section of the transmission line, for carrying trigger pulses;

a plurality of superconducting sensors magnetically coupled to, and aligned along, the receiving section of the transmission line, said sensors being responsive to the trigger pulses; and a controller supplying said trigger pulses to said triggers at predetermined times to drive said triggers and direct said sensors to magnetically sample associated points along said transmission line.

2. The high-speed receiver of claim 1, further comprising:

a plurality of data outputs connected to the plurality of superconducting sensors; and means for coupling the data outputs onto a transmission medium.

3. The high-speed receiver of claim 1, wherein at least one of the plurality of superconducting sensors comprises a comparator for comparing a detected magnetic field with a threshold and outputting a data value based on the comparison.

4. The high-speed receiver of claim 1, wherein at least one of the plurality of superconducting sensors comprises an analog to digital converter.

5. The high-speed receiver of claim 1, wherein at least one of the plurality of superconducting sensors comprises a logic function.

6. The high-speed receiver of claim 1, wherein at least one of the plurality of superconducting sensors comprises:

at least one Josephson junction;

a DC bias input connected to the Josephson junction;

a data output connected to the Josephson junction.

7. The high-speed receiver of claim 1, wherein the information signal is a digital signal.

8. The high-speed receiver of claim 1, wherein the information signal is an analog signal.

9. The high-speed receiver of claim 1, wherein the information signal comprises at least one analog portion and at least one digital portion.

10. The high-speed receiver of claim 1, wherein the superconducting transmission line is constructed as a microstrip transmission line.

11. The high-speed receiver of claim 1, wherein the superconducting transmission line is routed on a semiconductor die in a snake-like or zig-zag fashion.

12. The high-speed receiver of claim 1, further comprising a termination resistor connected to the transmission line.

13. A method for receiving data from a receiving section of a transmission line carrying an information signal, comprising the steps of:

(a) transmitting data in an information signal along a superconducting transmission line;

(b) magnetically coupling a plurality of superconducting sensors to the transmission line;

(c) after allowing the information signal to propagate for a predetermined time along the superconducting transmission line, activating the superconducting sensors to simultaneously detect data values at a plurality of points along the transmission line;

(d) deactivating the sensors until the information signal propagates along the transmission line for a predetermined time.

14. The method of claim 13, further comprising the step of: inducing triggering magnetic pulses into a magnetic field proximate said sensors to activate the sensors.

15. The method of claim 13, further comprising the step of: upon activation, comparing a detected value at an associated point along said transmission line with a threshold value to determine a corresponding data value.

16. The method of claim 13, further comprising the step of:

upon activation, producing a digital value representing the data value at an associated point along said transmission line.

17. The method of claim 13, further comprising the step of:

upon activation, producing a logic function output based on at least one of the detected data values.

18. The method of claim 13, wherein the step of transmitting data in an information signal comprises transmitting analog data.

19. The method of claim 13, wherein the step of transmitting data in an information signal comprises transmitting digital data.

20. The method of claim 13, wherein the step of transmitting data in an information signal comprises transmitting at least one set of digital data and at least one set of analog data.

* * * * *